United States Patent
Sumino et al.

(10) Patent No.: US 10,790,397 B2
(45) Date of Patent: Sep. 29, 2020

(54) SEMICONDUCTOR DEVICE AND METHOD FOR MANUFACTURING THE SAME

(71) Applicant: Mitsubishi Electric Corporation, Tokyo (JP)

(72) Inventors: Tasuku Sumino, Tokyo (JP); Takayuki Hisaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/472,402

(22) PCT Filed: Feb. 27, 2017

(86) PCT No.: PCT/JP2017/007350
§ 371 (c)(1),
(2) Date: Jun. 21, 2019

(87) PCT Pub. No.: WO2018/154754
PCT Pub. Date: Aug. 30, 2018

(65) Prior Publication Data
US 2019/0378935 A1    Dec. 12, 2019

(51) Int. Cl.
| | |
|---|---|
| *H01L 29/812* | (2006.01) |
| *H01L 29/423* | (2006.01) |
| *H01L 29/47* | (2006.01) |
| *H01L 29/40* | (2006.01) |
| *H01L 21/321* | (2006.01) |

(52) U.S. Cl.
CPC .......... *H01L 29/812* (2013.01); *H01L 21/321* (2013.01); *H01L 29/401* (2013.01); *H01L 29/42316* (2013.01); *H01L 29/475* (2013.01)

(58) Field of Classification Search
CPC ................ H01L 29/812; H01L 29/401; H01L 29/42316; H01L 29/475; H01L 21/321
USPC ......................................................... 257/280
See application file for complete search history.

(56) References Cited

FOREIGN PATENT DOCUMENTS

| JP | 62016574 A | * | 1/1987 |
|---|---|---|---|
| JP | 2001-265011 A | | 9/2001 |
| JP | 2003-133333 A | | 5/2003 |
| JP | 2009-105120 A | | 5/2009 |
| JP | 2013-229486 A | | 11/2013 |

OTHER PUBLICATIONS

International Search Report; Written Opinion; and Notification of Transmittal of the International Search Report and the Written Opinion of the International Searching Authority, or the Declaration issued in PCT/JP2017/007350; dated May 23, 2017.

* cited by examiner

*Primary Examiner* — Tong-Ho Kim
(74) *Attorney, Agent, or Firm* — Studebaker & Brackett PC

(57) ABSTRACT

A gate electrode (6) is provided on the semiconductor layer (2) and a least includes a lowermost layer (6a) in contact with the semiconductor layer (2), and an upper layer (6b) provided on the lowermost layer (6a). The upper layer (6b) applies stress to the lowermost layer (6a) to cause both edges of the lowermost layer (6a) to curl up from the semiconductor layer (2).

5 Claims, 4 Drawing Sheets

SOLID-PHASE REACTION

SEMICONDUCTOR DEVICE AND METHOD FOR MANUFACTURING THE SAME

FIELD

The present invention relates to a semiconductor device and a method for manufacturing the same, wherein the gate length can be reduced in a simple manner to improve high-frequency characteristics.

BACKGROUND

Miniaturization of electrodes, wiring and so on that constitute semiconductor devices has progressed to meet the demands for further downsizing and higher performance of semiconductor devices. Shortening the gate length to reduce the channel transit time of electrons is one technique adopted to improve high-frequency characteristics of transistors. When the operating frequency bandwidth of a transistor exceeds the conversion frequency ($f_K$) of the transistor, a rapid drop, by −6 dB/oct, of transistor gain is observed. Accordingly, in order to obtain a less frequency-dependent, stable transistor with a sufficiently large gain, it is effective to shorten the gate length and reduce gate-source capacitance component ($C_{gs}$) to improve $f_K$. In the field of compound semiconductors, in particular, shorter gate length has been strongly demanded to make the most of favorable high-frequency characteristics of materials. To this end, for example, use of shorter wavelengths for exposure light sources, electron-beam lithography, entire pattern slimming, etc. have been adopted (see, for example, PTL 1).

CITATION LIST

Patent Literature

[PTK 1] Japanese Patent Application Laid-open No. 2001-265011

SUMMARY

Technical Problem

The gate length of conventional semiconductor devices was subject to limitations by dimensions that are transferred when gate electrodes are formed. Therefore, to obtain a semiconductor with a sufficiently short gate length, it was necessary to introduce expensive exposure equipment, develop sophisticated transfer techniques, and manage processes meticulously. The problem was that realization of these measures would cost a significant expenditure of time and money.

The present invention was made to solve the problem described above and it is an object of the invention to provide a semiconductor device and a method for manufacturing the same, wherein the gate length can be reduced in a simple manner to improve high-frequency characteristics.

Solution to Problem

A semiconductor device according to the present invention includes: a semiconductor layer; and a gate electrode provided on the semiconductor layer and a least including a lowermost layer in contact with the semiconductor layer, and an upper layer provided on the lowermost layer, wherein the upper layer applies stress to the lowermost layer to cause both edges of the lowermost layer to curl up from the semiconductor layer.

Advantageous Effects of Invention

In the present invention, the upper layer of the gate electrode applies stress to the lowermost layer to cause both edges of the lowermost layer to curl up from the semiconductor layer. This way, the gate length can be made shorter than the transferred length without introducing expensive exposure equipment, without developing sophisticated transfer techniques, and without meticulous process management. Thus the gate length is shortened in a simple manner to improve high-frequency characteristics.

DESCRIPTION OF EMBODIMENTS

A semiconductor device and a method for manufacturing the same according to the embodiments of the present invention will be described with reference to the drawings. The same components will be denoted by the same symbols, and the repeated description thereof may be omitted.

Embodiment 1

Figure 1:
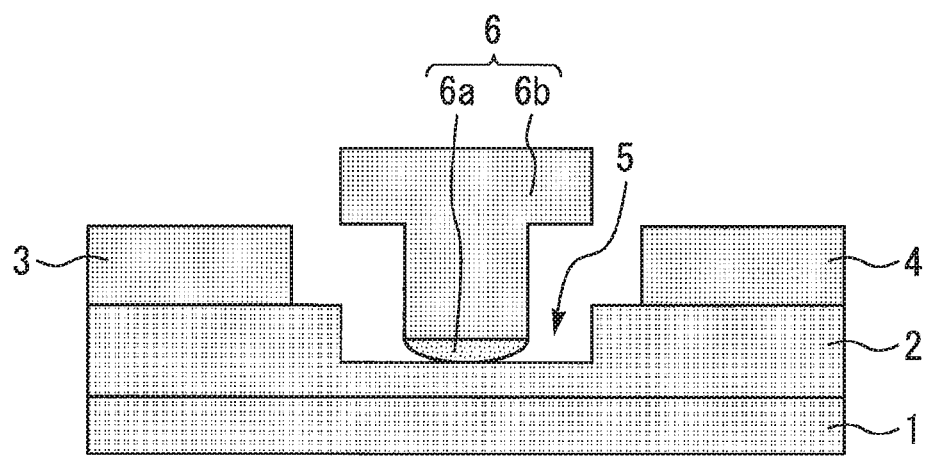
FIG. 1 is a cross-sectional view illustrating a semiconductor device according to Embodiment 1 of the present invention.

FIG. 1 is a cross-sectional view illustrating a semiconductor device according to Embodiment 1 of the present invention. A semiconductor layer 2 of a compound semiconductor such as GaAs and the like is formed on a semiconductor substrate 1. A source electrode 3 and a drain electrode 4 are formed on the semiconductor layer 2 and are in Ohmic contact with the semiconductor layer 2. A recessed structure 5 is formed in the surface of the semiconductor layer 2 between the source electrode 3 and the drain electrode 4. Inside this recessed structure 5, a T-shaped gate electrode 6 is formed on the semiconductor layer 2.

The gate electrode 6 at least includes a lowermost layer 6a in direct contact and in Schottky contact with the semiconductor layer 2, and an upper layer 6b formed upon the lowermost layer 6a. The gate electrode 6 includes two or more metal layers. Here, the gate electrode is layers of Pt/Ti/Pt/Au stacked in this order from the bottom upwards. The upper layer 6b applies stress to the lowermost layer 6a to cause both edges of the lowermost layer 6a to curl up from the semiconductor layer 2.

Figure 2:
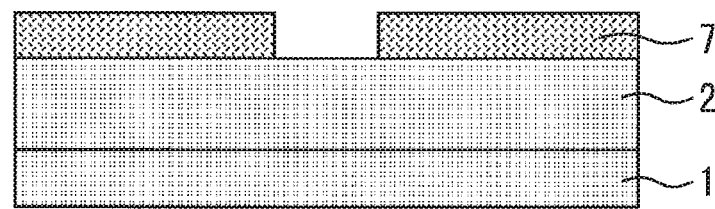
FIG. 2 is a cross-sectional view for explaining a method for manufacturing the semiconductor device according to Embodiment 1 of the present invention.
Figure 3:
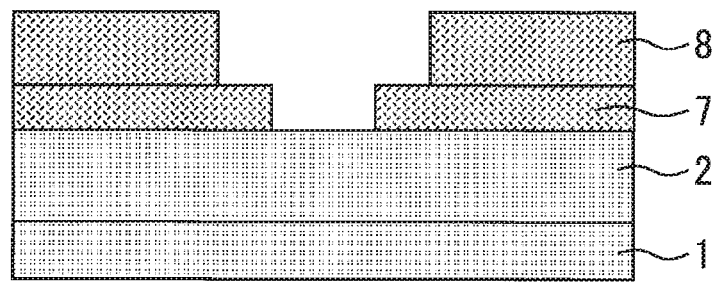
FIG. 3 is a cross-sectional view for explaining a method for manufacturing semiconductor device according to Embodiment 1 of the present invention.
Figure 4:
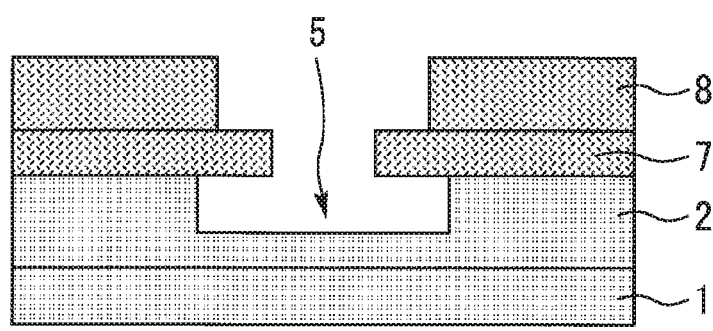
FIG. 4 is a cross-sectional view for explaining a method for manufacturing the semiconductor device according to Embodiment 1 of the present invention.

FIG. 2 to FIG. 6 are cross-sectional views for explaining a method for manufacturing the semiconductor device according to Embodiment 1 of the present invention. First, as shown in FIG. 2, a semiconductor layer 2 is formed on a semiconductor substrate 1, and the semiconductor layer 2 is coated with a first layer of resist 7. The resist 7 is patterned by electron beam exposure and development. Next, as shown in FIG. 3, a second layer of resist 8 is applied, and the resist 8 is patterned by electron beam exposure and development. Next, as shown in FIG. 4, the semiconductor layer 2 is etched using the resists 7 and 8 as a mask to form a recessed structure 5.

Figure 5:
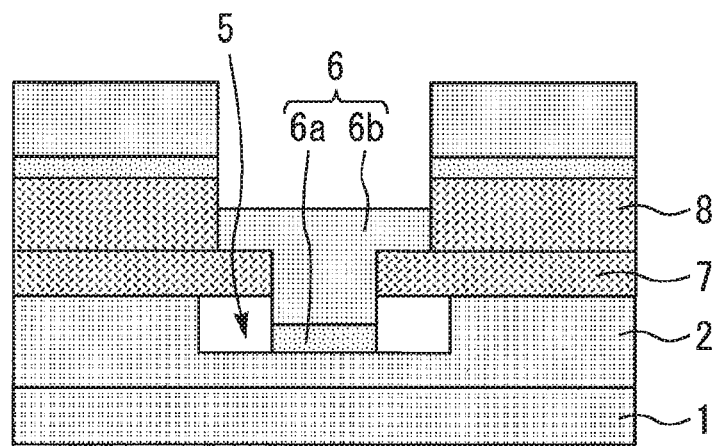
FIG. 5 is a cross-sectional view for explaining a method for manufacturing semiconductor device according to Embodiment 1 of the present invention.
Figure 6:
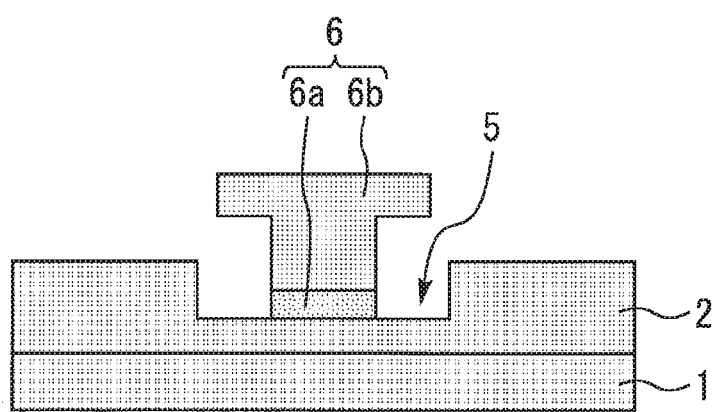
FIG. 6 is a cross-sectional view for explaining a method for manufacturing the semiconductor device according to Embodiment 1 of the present invention.

Next, as shown in FIG. 5, a lowermost layer 6a and an upper layer 6b are successively vapor-deposited on the entire surface. Next, as shown in FIG. 6, a gate electrode 6 is formed by a lilt-off process wherein the resists 7 and 8 are removed together with the lowermost layer 6a and upper layer 6b formed thereabove.

Figure 7:
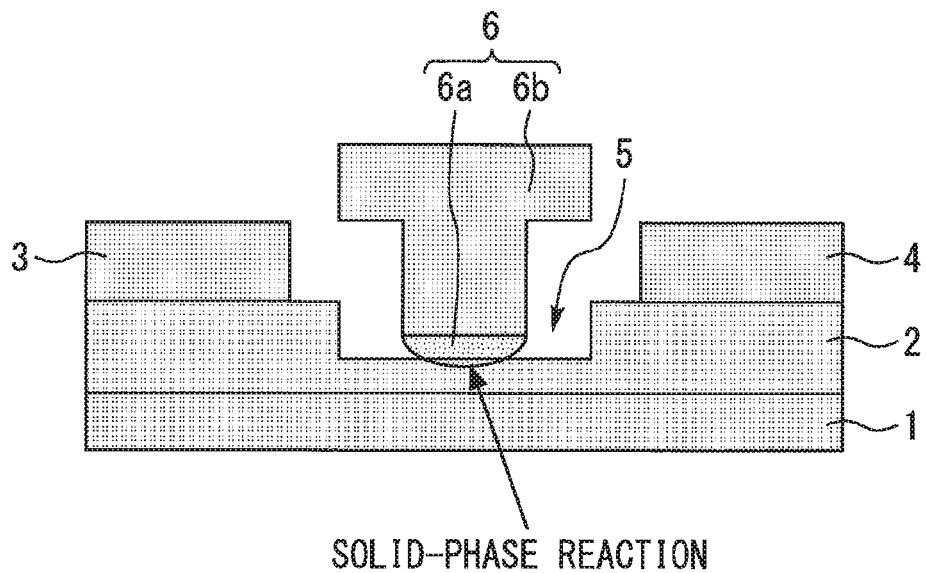
FIG. 7 is a cross-sectional view illustrating a semiconductor device according to Embodiment 2 of the present invention.

Next, as shown in FIG. 7, a heat treatment is performed so that the upper layer 6b applies stress to the lowermost layer 6a to cause both edges of the lowermost layer 6a to curl up from the semiconductor layer 2. Here, the metals forming the lowermost layer 6a and the upper layer 6b have to be such a combination that the upper layer 6b applies stress to the lowermost layer 6a when a heat treatment is performed. The time, temperature and so on of the heat treatment are set in accordance with the gate length, electrode thickness and so on so that both edges of the lowermost layer 6a curl up. In an actual experiment, curling up of both edges of the lowermost layer 6a was observed in a two-minute heat treatment at 360° C. when the lowermost layer 6a of the gate electrode 6 was a Pt layer of a thickness of 5 nm or less and the upper layer 6b was a Ti layer of a thickness of 80 nm or more.

As demonstrated above, the upper layer 6b of the gate electrode 6 applies stress to the lowermost layer 6a and causes both edges of the lowermost layer 6a to curl up from the semiconductor layer 2. This way, the gate length can be made shorter than the transferred length without introducing expensive exposure equipment, without developing sophisticated transfer techniques, and without meticulous process management. Thus the gate length is shortened in a simple manner to improve high-frequency characteristics.

Embodiment 2

FIG. 7 is a cross-sectional view illustrating a semiconductor device according to Embodiment 2 of the present invention. The lowermost layer 6a is a metal such as Pt having solid-phase reactivity to the semiconductor layer 2 made of GaAs, for example. In this case, when heat is applied after formation of the gate electrode 6, a central portion of the lowermost layer 6a is solid-phase-reacted with the semiconductor layer 2 and becomes alloyed. Therefore, even though both edges of the lowermost layer 6a curl up and the contact area with the semiconductor layer 2 is reduced, a sufficient bond strength is achieved. This prevents separation of the gate electrode 6 that may be caused by a water jet flow during subsequent lift-off or dicing processes, whereby an improvement in the yield is expected. Other configurations and effects are similar to those of Embodiment 1.

Embodiment 3

Figure 8:
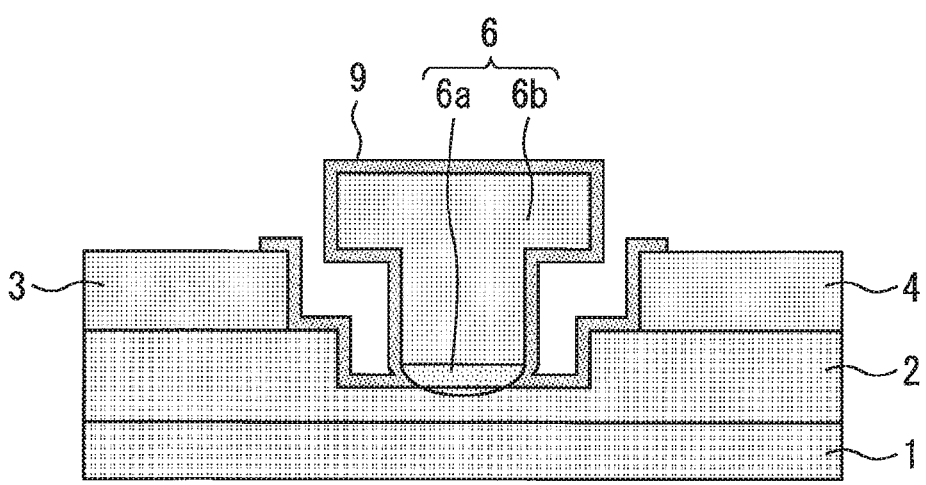
FIG. 8 is a cross-sectional view illustrating a semiconductor device according to Embodiment 3 of the present invention.

FIG. 8 is a cross-sectional view illustrating a semiconductor device according to Embodiment 3 of the present invention. A protection film 9 covers both curled-up edges of the lowermost layer 6a. A p-CVD film of $SiO_2$ or $Si_3N_4$, for example, which is commonly used as a protection film in semiconductor device manufacturing processes, can hardly cover the curled-up portions of the gate electrode 6. Here, the protection film 9 is an insulating film with a satisfactorily good step coverage, formed for example by an ALD (Atomic Layer Deposition) method and including atomic layers deposited alternately.

As the protection film 9 covers both curled-up edges of the lowermost layer 6a, the moisture resistance of the semiconductor device can be improved. Moreover, an overlap gate structure is realized, which causes electric Field peaks to be dispersed to an end portion of the gate electrode 6 in contact with the semiconductor layer 2 and an electrode end of the protection film 9. This alleviates electric field concentration and reduces the effect of velocity overshoot, resulting in a better drain conductance. Other configurations and effects are similar to those of Embodiment 2.

REFERENCE SIGNS LIST 2 semiconductor layer; 6 gate electrode; 6a lowermost layer; 6b upper layer; 9 protection film

The invention claimed is:

1. A semiconductor device comprising:
   a semiconductor layer; and
   a gate electrode provided on the semiconductor layer and at least including a lowermost layer in contact with the semiconductor layer, and an upper layer provided on the lowermost layer,
   wherein the upper layer applies thermal stress to the lowermost layer to cause both edges of the lowermost layer to curl up from the semiconductor layer,
   the lowermost layer is a Pt layer,
   the upper layer is a Ti layer, and
   a central portion of the lowermost layer is solid-phase-reacted with the semiconductor layer.

2. The semiconductor device according to claim 1, further comprising a protection film covering the both curled-up edges of the lowermost layer.

3. The semiconductor device according to claim 2, wherein the protection film is an insulating film including atomic layers deposited alternately.

4. A method for manufacturing a semiconductor device comprising:
   forming a gate electrode on a semiconductor layer wherein the gate electrode at least includes a lowermost layer in contact with the semiconductor layer, and an upper layer provided on the lowermost layer, and
   performing a heat treatment so that the upper layer applies thermal stress to the lowermost layer to cause both edges of the lowermost layer to curl up from the semiconductor layer,
   wherein the lowermost layer is a Pt layer,
   the upper layer is a Ti layer, and
   a central portion of the lowermost layer is solid-phase-reacted with the semiconductor layer by the heat treatment.

5. The method for manufacturing a semiconductor device according to claim 4, further comprising forming a protection film covering the both curled-up edges of the lowermost layer by an Atomic Layer Deposition method.

\* \* \* \* \*